United States Patent [19]
Vu et al.

[11] Patent Number: 6,031,399
[45] Date of Patent: Feb. 29, 2000

[54] SELECTIVELY CONFIGURABLE ANALOG SIGNAL SAMPLER

[75] Inventors: Ha Chu Vu, San Jose; Seema Varma, Mountain View, both of Calif.

[73] Assignee: National Semiconductor Corporation, Santa Clara, Calif.

[21] Appl. No.: 09/023,681

[22] Filed: Feb. 13, 1998

[51] Int. Cl.[7] .................................................. G11C 27/02
[52] U.S. Cl. ............................................................ 327/96
[58] Field of Search ................................ 327/91, 93, 94, 327/95, 96, 554; 330/9; 341/122; 348/241, 250

[56] References Cited

U.S. PATENT DOCUMENTS

| | | | |
|---|---|---|---|
| 3,781,574 | 12/1973 | White et al. | 307/304 |
| 4,035,629 | 7/1977 | Lampe et al. | 235/193 |
| 4,287,441 | 9/1981 | Smith | 307/353 |
| 5,034,633 | 7/1991 | Stekelenburg | 307/352 |
| 5,086,344 | 2/1992 | D'Luna et al. | 358/213.15 |
| 5,144,160 | 9/1992 | Lee et al. | 327/94 |
| 5,329,312 | 7/1994 | Boisvert et al. | 348/256 |
| 5,349,380 | 9/1994 | Stein | 349/250 |
| 5,434,620 | 7/1995 | Higuchi et al. | 348/308 |
| 5,449,908 | 9/1995 | Wadsworth et al. | 250/332 |
| 5,475,427 | 12/1995 | Horowitz | 348/241 |
| 5,572,155 | 11/1996 | Tamayama | 327/94 |
| 5,600,606 | 2/1997 | Sauer | 377/60 |
| 5,644,257 | 7/1997 | Kerth et al. | 327/96 |
| 5,680,072 | 10/1997 | Vulih et al. | 327/554 |
| 5,689,201 | 11/1997 | Temes et al. | 327/327 |
| 5,698,999 | 12/1997 | Etoh et al. | 327/94 |
| 5,717,457 | 2/1998 | Morimoto | 348/241 |
| 5,736,895 | 4/1998 | Yu et al. | 327/554 |

OTHER PUBLICATIONS

Jaroslav Hynecek, "Theoretical Analysis and Optimization of CDS Signal Processing Method for CCD Image Sensors", IEEE Transactions of Electron Devices, vol. 39, No. 11, Nov. 1992, pp. 2497–2507.

Robert J. Kansy, "Response of a Correlated Double Sampling Circuit to 1/f Noise", IEEE Journal of Solid–State Circuits, vol. SC–15, No. 3, Jun. 1980, pp. 373–375.

Masahiro Ohbo, Ikuo Akiyama, Takanori Tanaka, "A New Noise Suppression Method for High–Definition CCD Cameras", IEEE Transactions on Consumer Electronics, vol. 35, No. 3, Aug. 1989, pp. 368–374.

G.R. Hopkinson and D.H. Lumb, "Noise Reduction Techniques for CCD Image Sensors", Journal of Physics E. Scientific Instruments, vol. 15, No. 11, Nov. 1982, pp. 1214–1222.

Marvin H. White, Donald R. Lampe, Franklyn C. Blaha and Ingham A. Mack, "Characterization of Surface Channel CCD Image Arrays at Low Light Levels", IEEE Journal of Solid–State Circuits, vol. SC–9, No. 1, Feb. 1974, pp. 1–13.

(List continued on next page.)

*Primary Examiner*—My-Trang Nu Ton
*Attorney, Agent, or Firm*—Limbach & Limbach L.L.P.

[57] ABSTRACT

A selectively configurable analog signal sampler, e.g., for use in an imaging system, for generating a differential sampled analog output signal which corresponds to a single-ended analog input signal with one or more signal characteristics including a positive signal polarity, a negative signal polarity, a return-to-reference signal waveform and a non-return-to-reference signal waveform. A switched capacitor matrix is configured, along with an operational amplifier with differential inputs and outputs, to allow all single-ended analog input signals with such signal characteristics to be sampled and converted to corresponding differential sampled analog output signals. Additionally, an accumulation mode of operation is provided in which the signal sampler accumulates N successive samples of the input signal and outputs the sum of such N samples, thereby allowing the signal sampler to operate at its rated speed while the circuit providing the input signal, e.g., an image sensor, operates at N-times such speed.

24 Claims, 17 Drawing Sheets

OTHER PUBLICATIONS

J.M. Pimbley and G. J. Michon, "The Output Power Spectrum Produced by Correlated Double Sampling", IEEE Transactions on Circuits and Systems, vol. 38, No. 9, Sep. 1991, pp. 1086–1090.

Anthony Rizzi, "N–Delta and Differential Average Signal Processors: Detailing of Their Signal and Noise Response", IEEE Journal of Solid–State Circuits, vol. 28, No. 1, Jan. 1993, pp. 49–58.

K.A. Parulski, L.J. D'Luna and R.H. Hibbard, "A Digital Color CCD Imaging System using Custom VLSI Circuits", IEEE Transactions on Consumer Electronics, vol. 35, No. 3, Aug. 1989, pp. 382–389.

Ryuji Nishimura, et al., "A RGB-$\gamma$ CCD Camera with a Novel Color Matrix", IEEE Transactions on Consumer Electronics, vol. 35, No. 3, Aug. 1989, pp. 375–381.

Stephen H. Lewis, H. Scott Fetterman, George F. Gross, Jr., R. Ramachandran, T.R. Viswanathan, "A 10–b 20–Msample/s Analog–to–Digital Converter", IEEE Journal of Solid–State Circuits, vol. 27, No. 3, Mar. 1992, pp. 351–358.

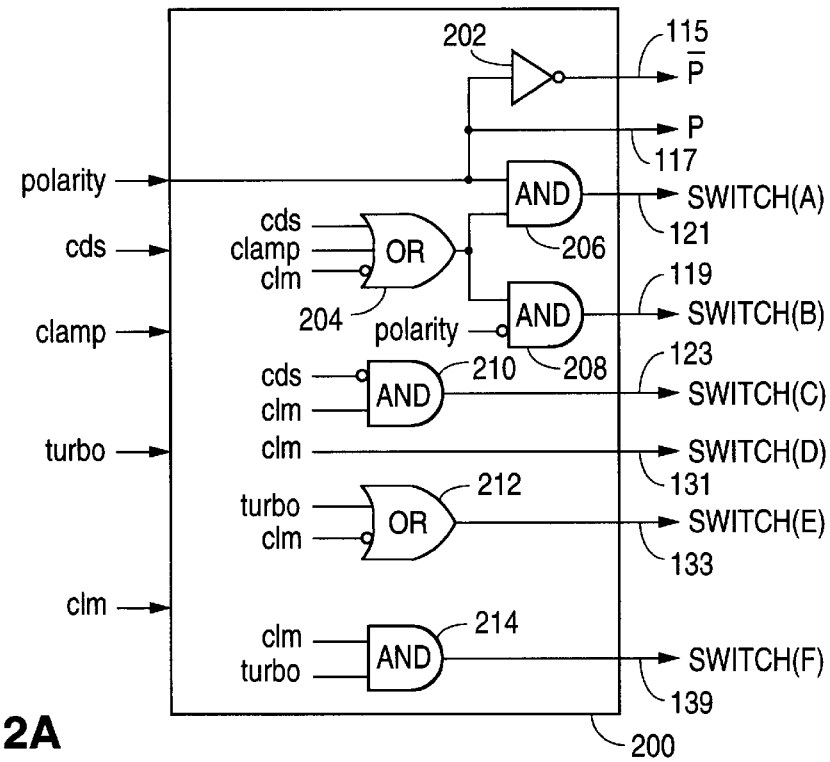

FIG. 2A

| Signal Name | Comment | High | Low |
|---|---|---|---|
| polarity (P) | Sensor type (CIS/CCD) | Positive Polarity | Negative Polarity |
| cds | Correlated Double Sampling Switch | CDS On (return-to-reference type of input) | CDS Off (non-return-to-reference of input) |
| clamp | Precharge input node during black pixels at start of every line | Precharge the input node to reference level | Normal operation (no precharge) |
| turbo | Do analog averaging of input signal by summing "n" consecutive input charges onto the output capacitor | Turbo mode off | - When turbo is a clock (has high-low and low-high transitions), the sampler if automatically in turbo mode |
| clm | Sample and hold clock for sampler | Discharge/clear input capacitor | Output tracks the input |

FIG. 2B

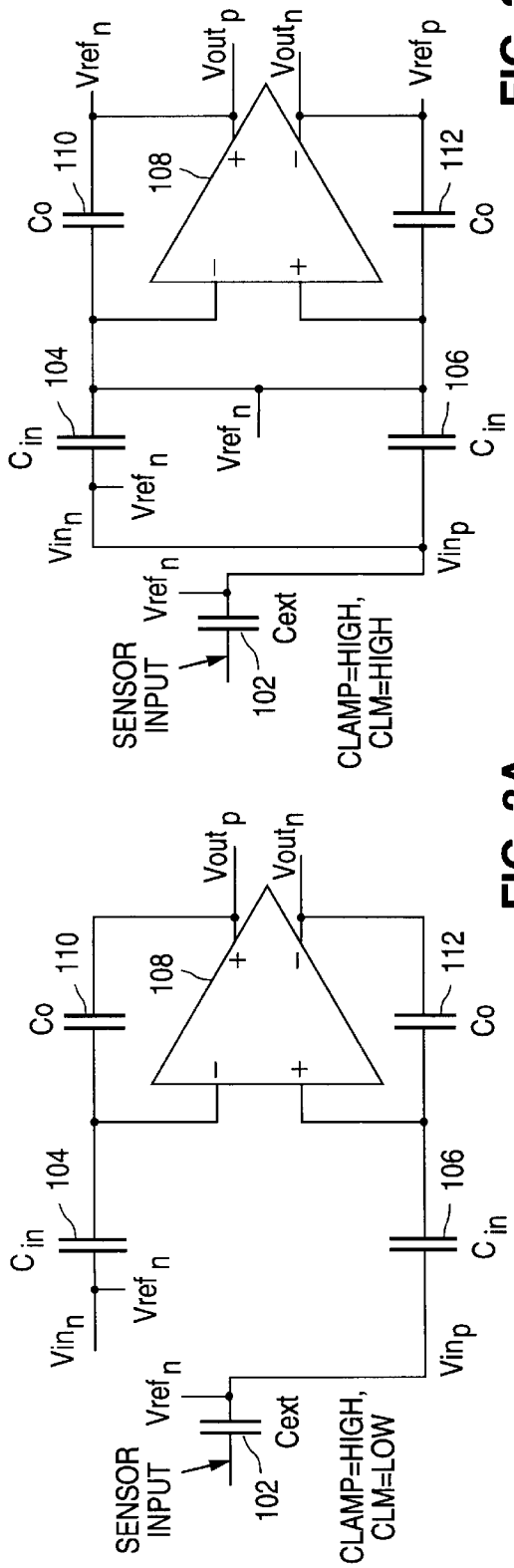
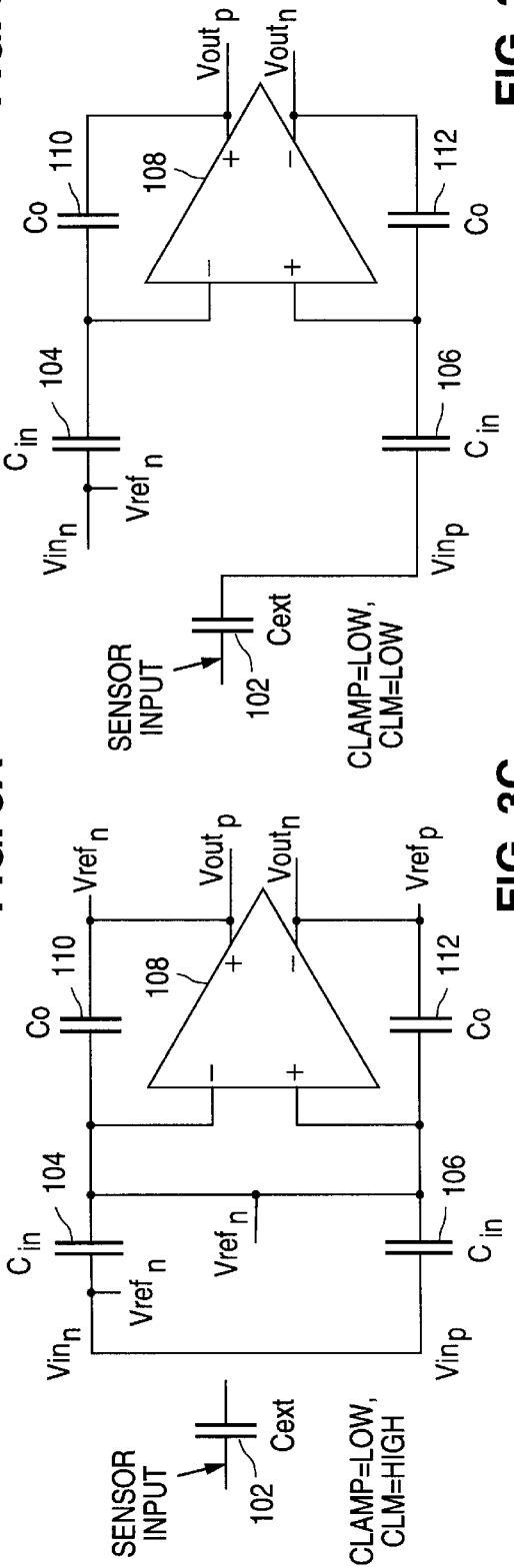

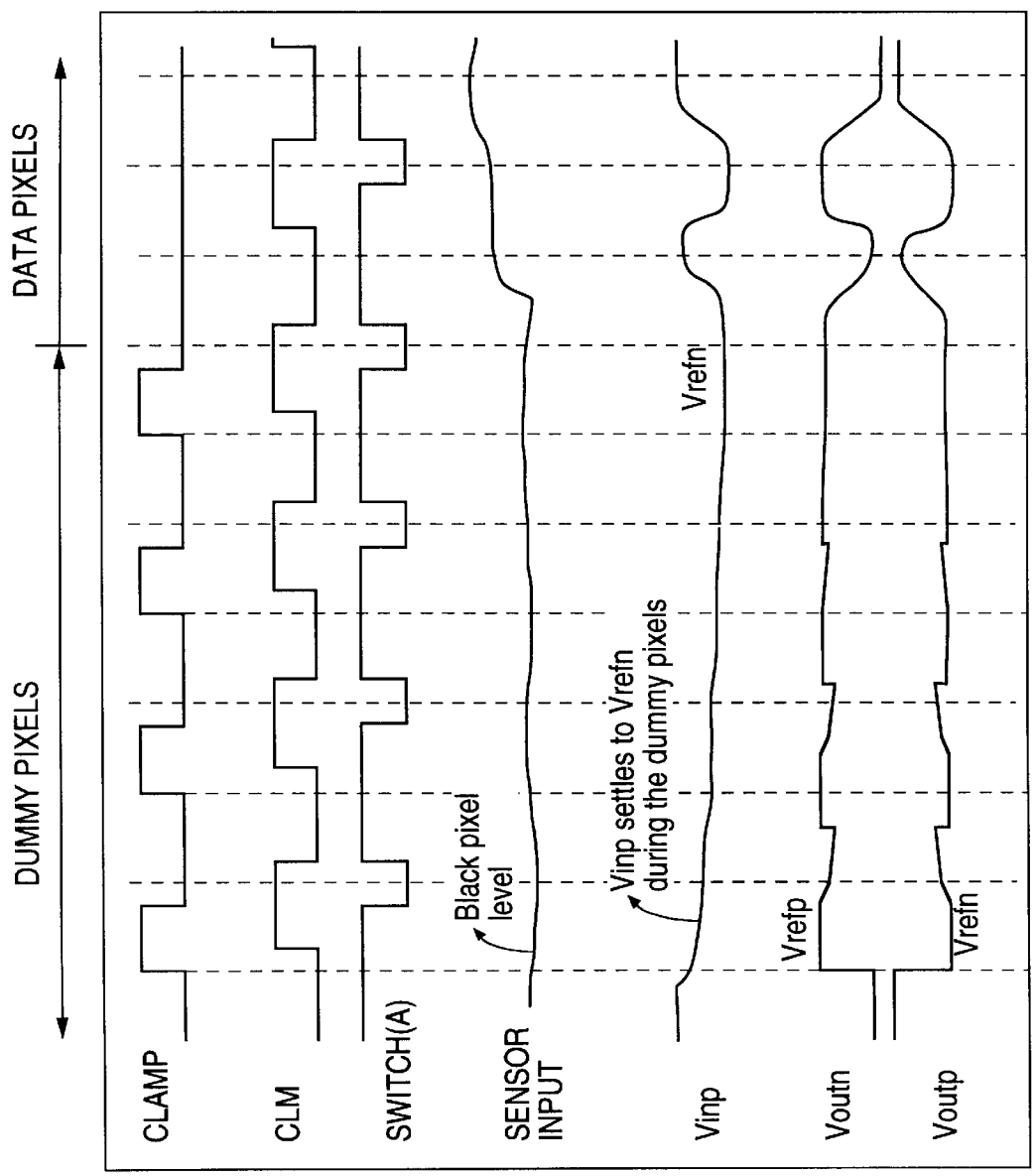

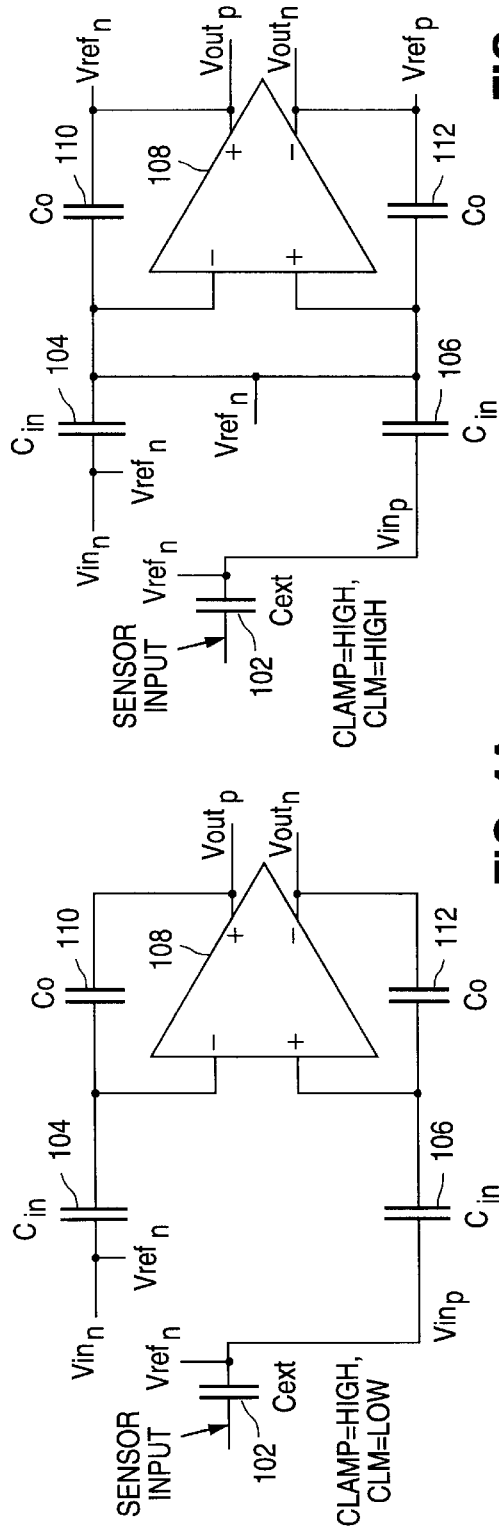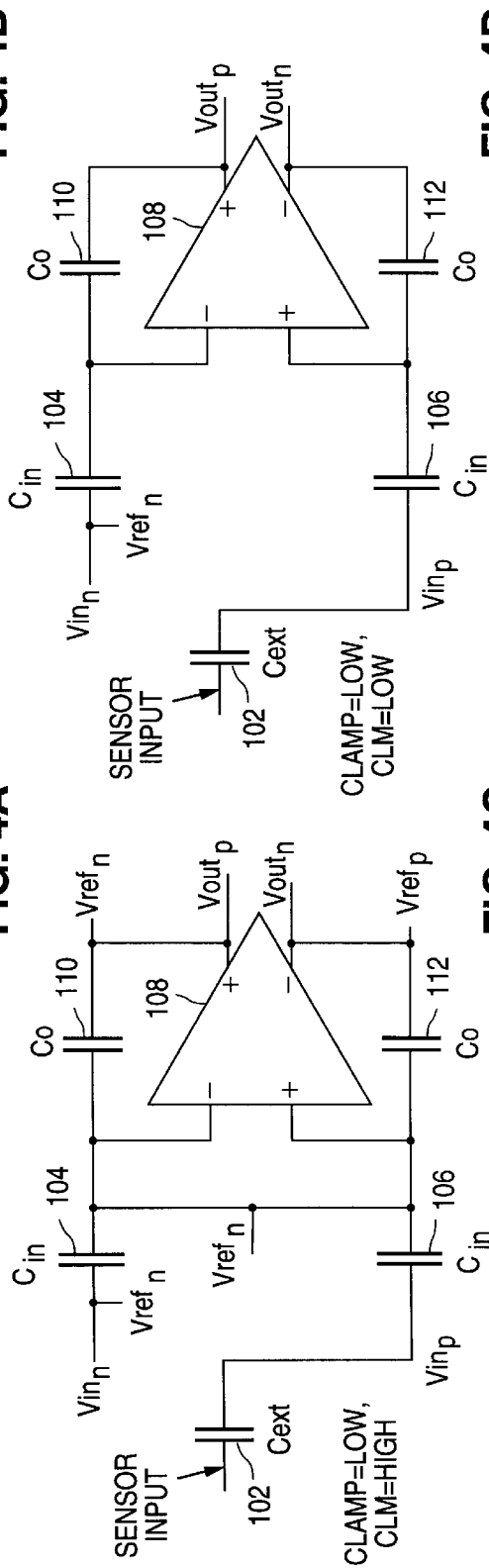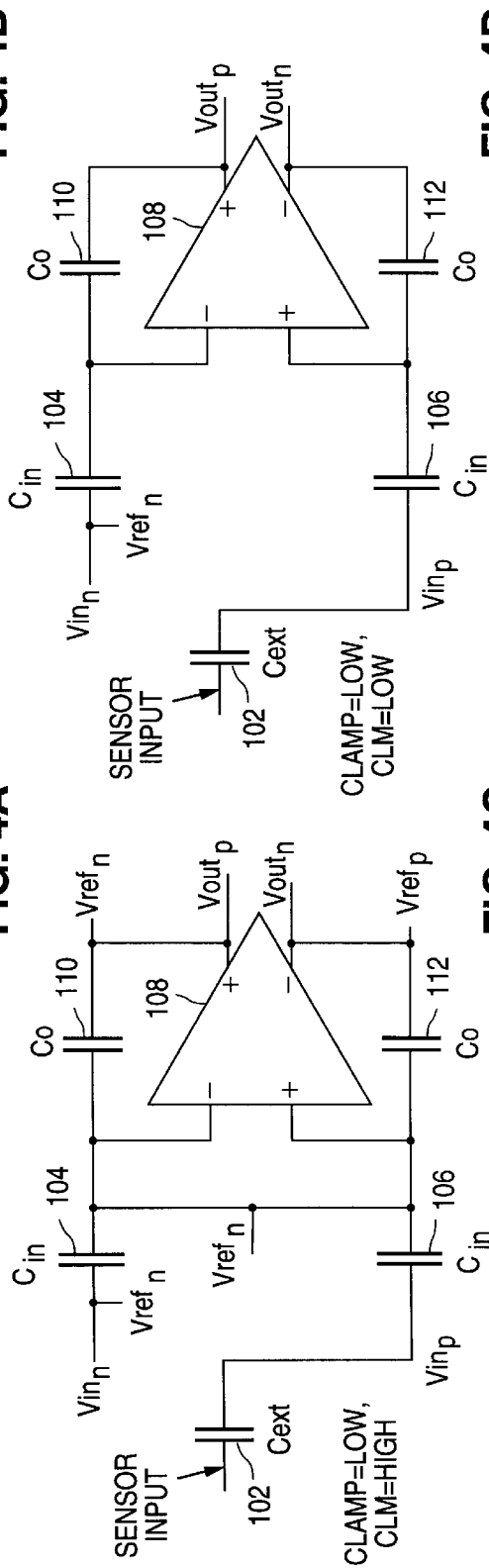

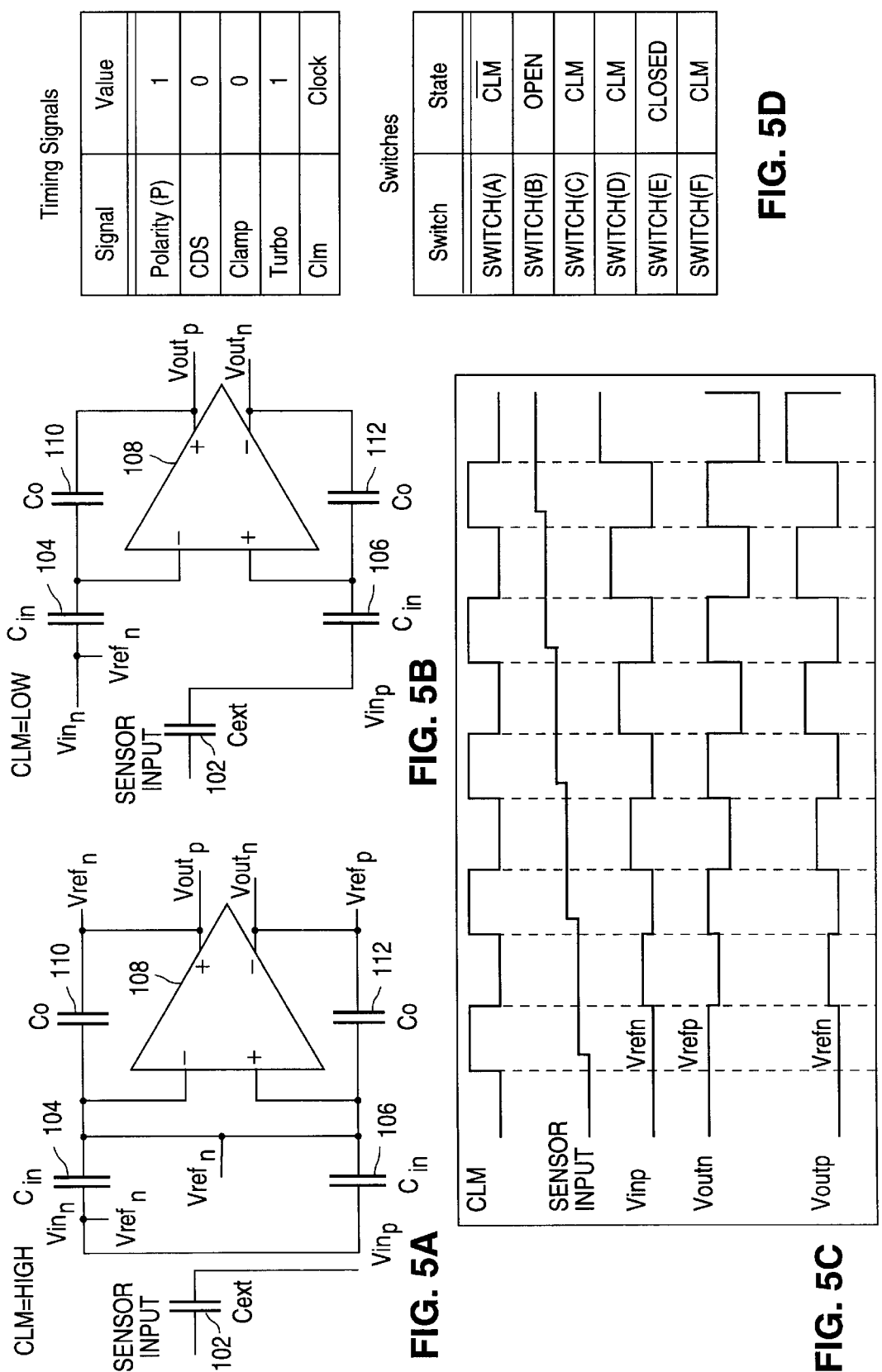

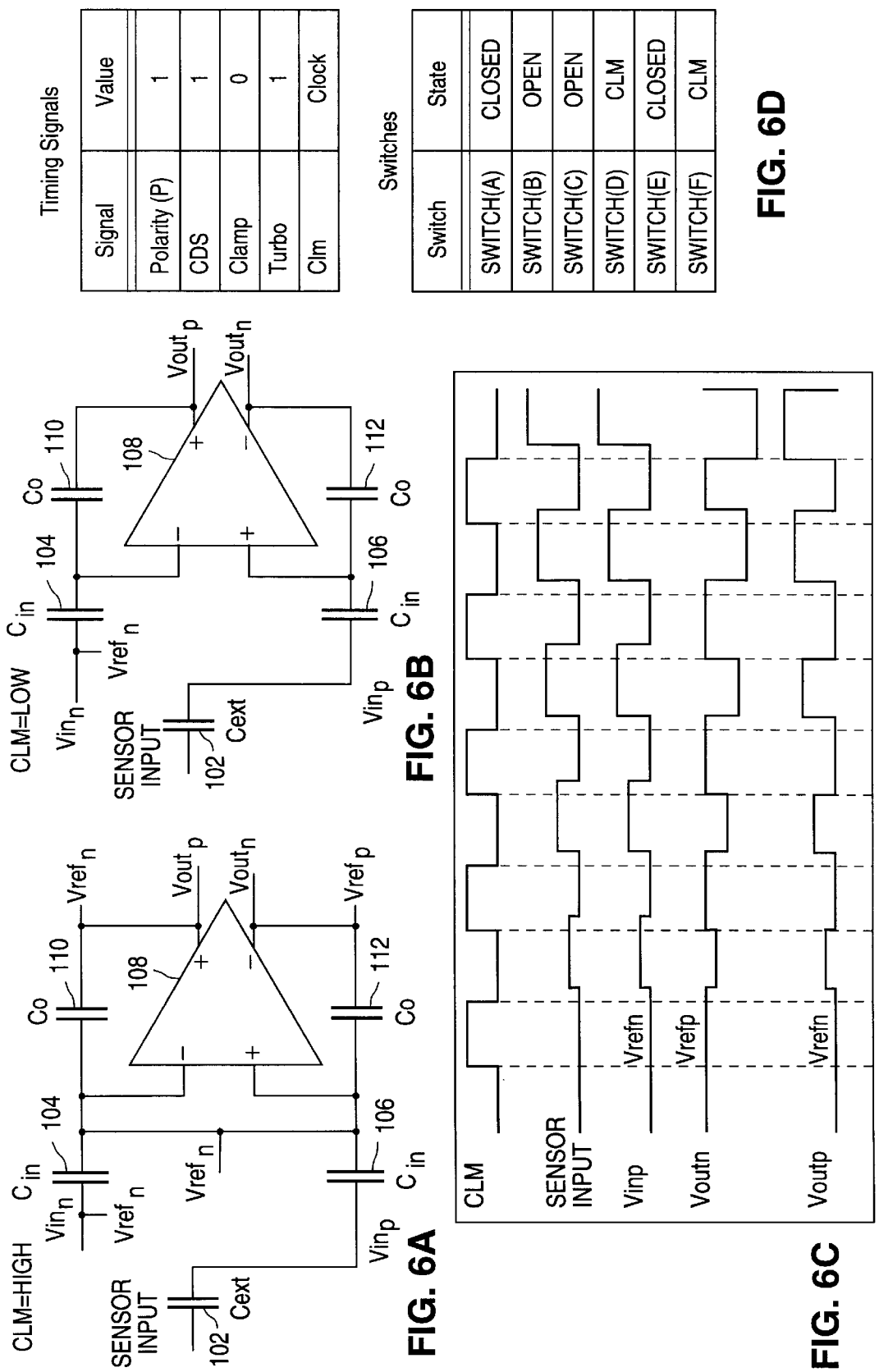

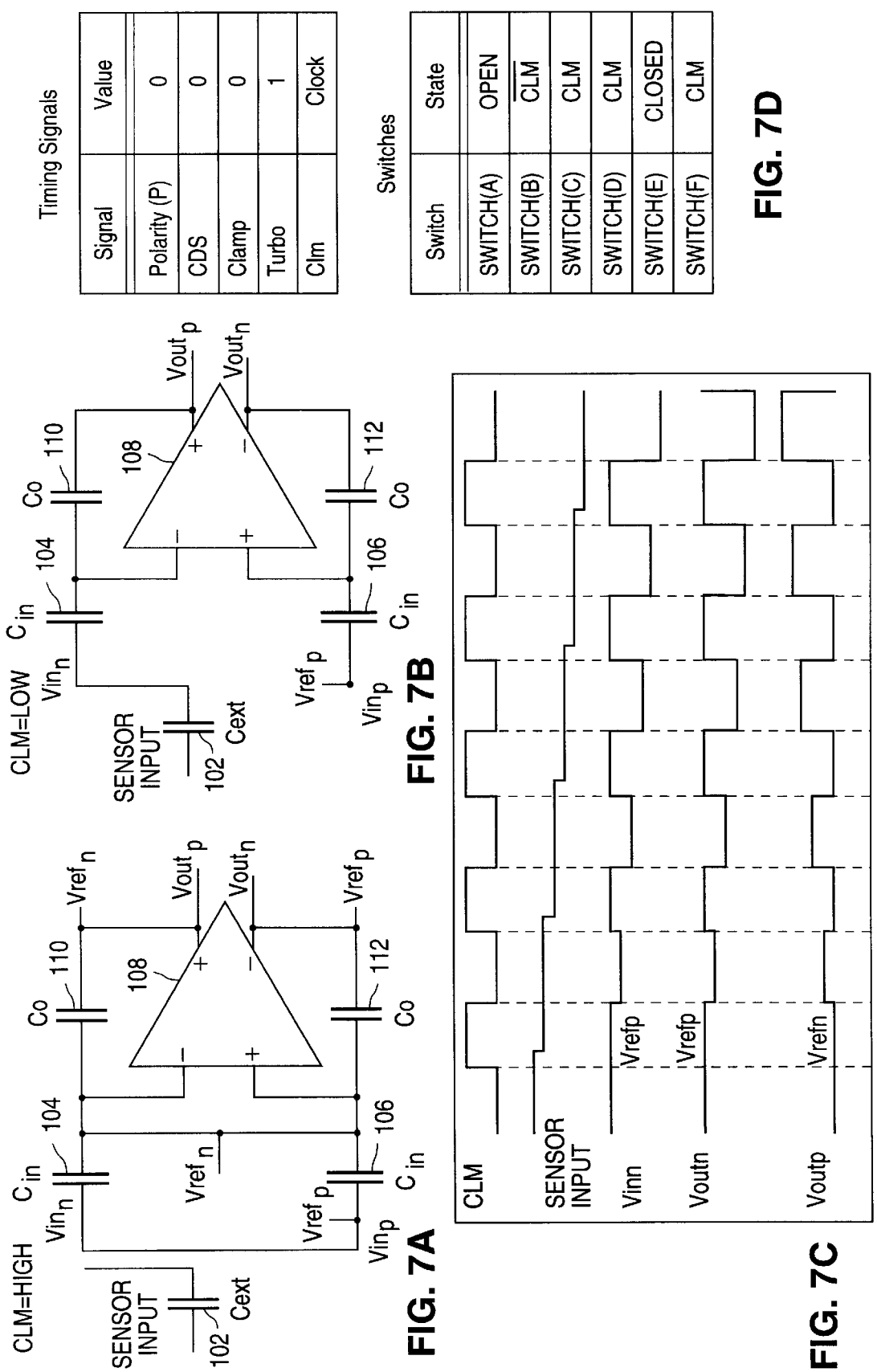

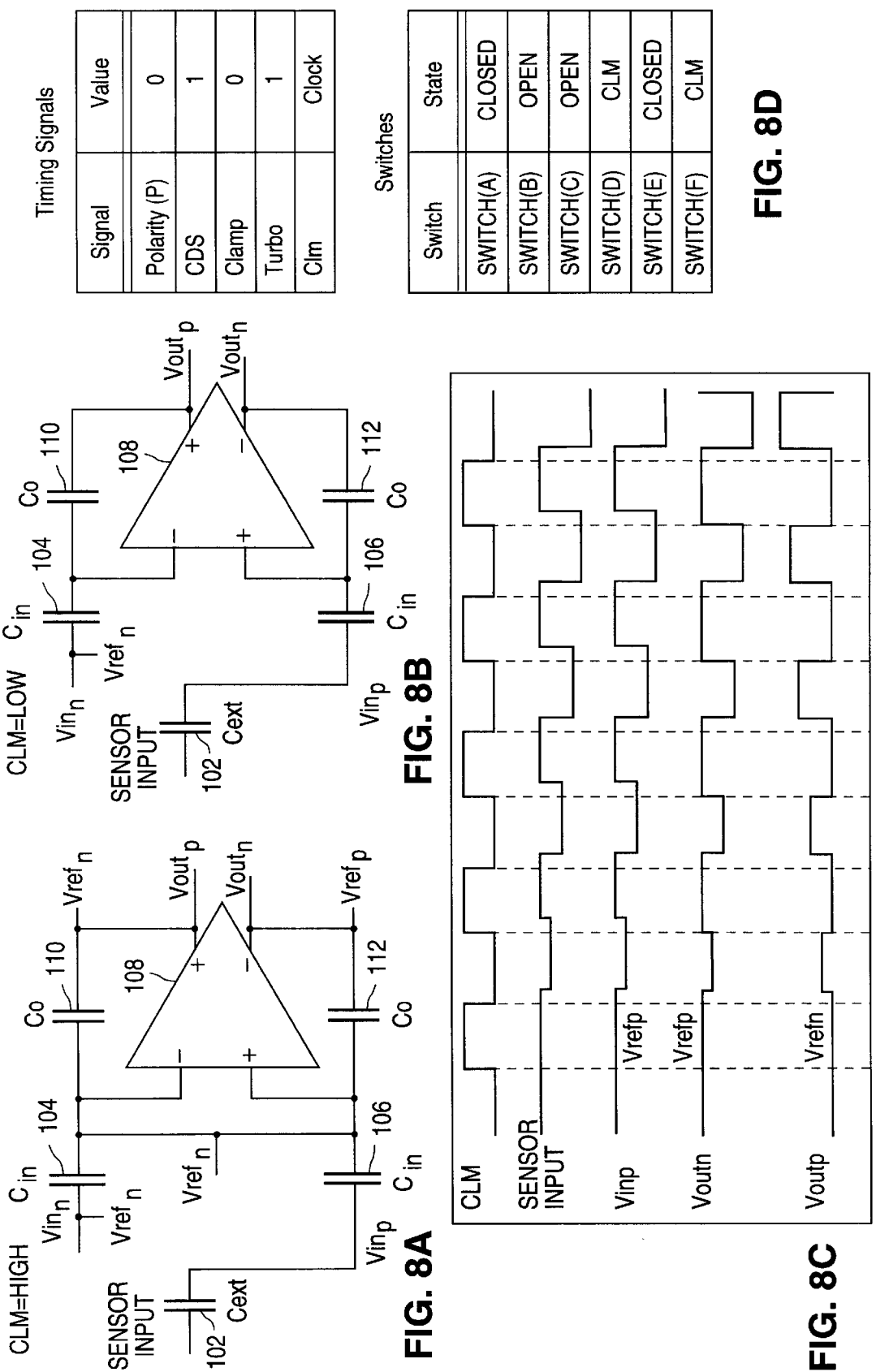

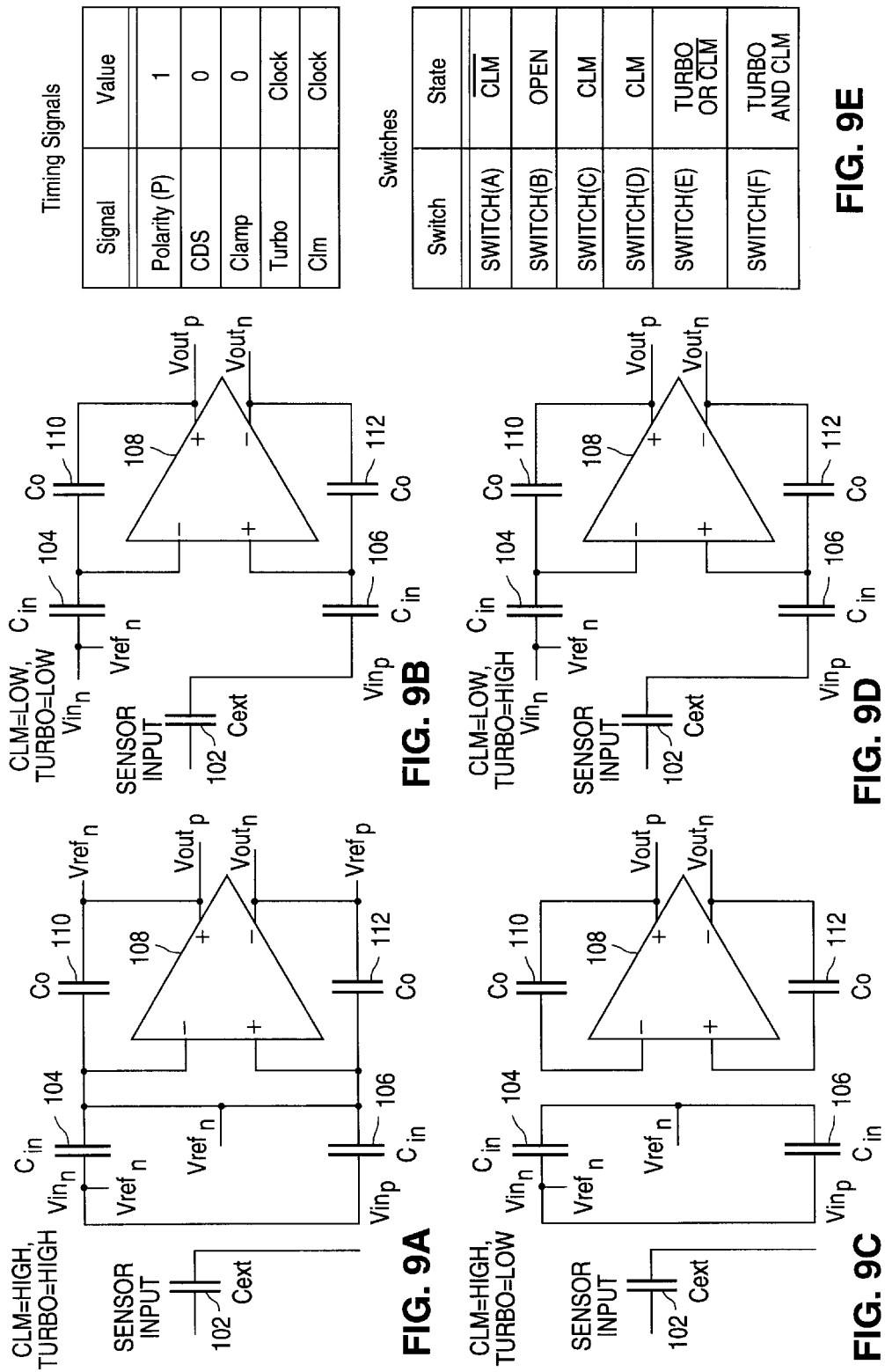

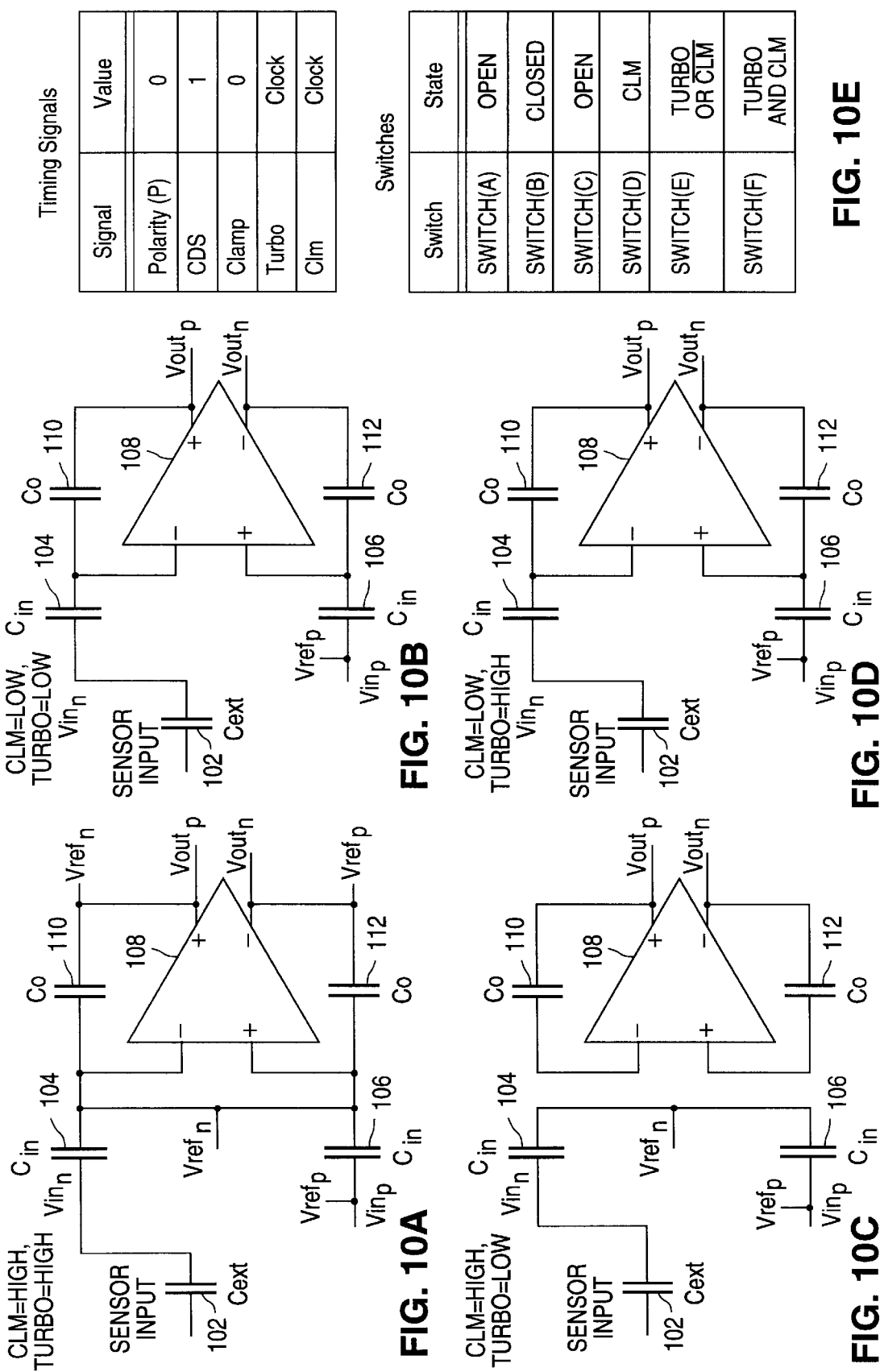

SELECTIVELY CONFIGURABLE ANALOG SIGNAL SAMPLER

BACKGROUND OF THE INVENTION

1. Field of the Invention

The present invention relates to sampling circuits for sampling analog signals, and in particular, sampling circuits which can be selectively configured to sample multiple types of analog signals, including "return-to-reference" and "non-return-to-reference" types of signals.

2. Description of the Related Art

Solid state image sensors are used in many imaging applications, such as scanners, digital cameras and video cameras. Two of the most widely used image sensors are charge coupled devices (CCD) and contact image sensors (CIS). The output image signals for a CCD sensor typically have a negative polarity, while the output image signals for a CIS sensor typically have a positive polarity. Furthermore, some sensors generate output signal waveforms of the type referred to as return-to-reference ("RTR"), i.e., where the output waveforms remain at the signal reference level (e.g., corresponding to the signal level for a black pixel) for a predetermined time interval during each pixel time period. For other types of sensors, however, the output signal waveform is of the type referred to as non-return-to-reference ("NRTR") where the output signal waveform does not necessarily go to the signal reference level during each pixel time period.

In those circuits where the sensor output signal goes to a reference level at every pixel, correlated double sampling ("CDS") is often used to reduce signal noise. With CDS, the difference between the reference level and the present signal level is sampled at every pixel, thereby causing low frequency input signal noise to be removed. However, in those applications where the sensor output signal does not return to the signal reference level at every pixel, CDS cannot be used. Accordingly, the difference between some preset reference voltage and the present signal level at the sensor output is sampled.

Accordingly, due to the widespread use of multiple types of image sensors which, in turn, produce multiple types of sensor output signal polarities and waveforms, it is desirable to have a sampling circuit for such analog signals which is selectively configurable and is, therefore, suitable for use in sampling all such types of analog image signals.

SUMMARY OF THE INVENTION

A selectively configurable analog signal sampler for sampling multiple types of analog signals in accordance with the present invention can be easily configured, as desired, to accurately sample analog signals provided by an image sensor regardless of whether such signals are of positive or negative polarity or a return-to-reference or non-return-to-reference type of signal.

Additionally, such a signal sampler can be operated in a faster accumulation mode whereby multiple successive input image signal values are accumulated and summed to produce a net output signal value. This allows the speed of the imaging system to increase by a factor equal to the number of successive signal values which are accumulated.

In accordance with one embodiment of the present invention, a selectively configurable analog signal sampler for sampling multiple types of analog signals includes capacitive circuits, an amplifier circuit and switch circuits. The switch circuits, coupled to the capacitive circuits and amplifier circuit, are configured to receive reference signals and switch control signals and in accordance therewith: couple together selected ones of the capacitive circuits; couple selected ones of the reference signals to the amplifier circuit and to further selected ones of the capacitive circuits; and couple the amplifier circuit to still further selected ones of the capacitive circuits. The capacitive circuits, the amplifier circuit and the switch circuits, together and in accordance with the reference signals and combinations of the switch control signals, receive and couple a single-ended analog input signal to the capacitive circuits and the amplifier circuit and in accordance therewith provide a differential sampled analog output signal which corresponds to the single-ended analog input signal. The single-ended analog input signal has one or more signal characteristics which include a positive signal polarity, a negative signal polarity, a return-to-reference signal waveform and a non-return-to-reference signal waveform.

In accordance with another embodiment of the present invention, a selectively configurable analog signal sampler for sampling multiple types of analog signals includes switching stages, capacitive stages and an amplifier stage. The first switching stage is configured to receive a first subset of a set of switch control signals and in accordance therewith receive a first subset of a set of reference signals and receive and switch a single-ended analog input signal and in accordance therewith provide a first switched analog signal. The single-ended analog input signal has one or more signal characteristics which include a positive signal polarity, a negative signal polarity, a return-to-reference signal waveform and a non-return-to-reference signal waveform. The first capacitive stage, coupled to the first switching stage, is configured to receive and capacitively couple the first switched analog signal and in accordance therewith provide a coupled analog signal. A second switching stage, coupled to the first capacitive stage, is configured to receive a second subset of the set of switch control signals and in accordance therewith receive a second subset of the set of reference signals and receive and switch the coupled analog signal and in accordance therewith provide a second switched analog signal. A second capacitive stage is coupled to the second switching stage, and the amplifier stage is coupled to the second switching stage and the second capacitive stage. A third switching stage, coupled to the amplifier stage and the second capacitive stage, is configured to receive a third subset of the set of switch control signals and in accordance therewith receive and switch a third subset of the set of reference signals and in accordance therewith provide a set of switched reference signals. The amplifier stage and the second capacitive stage together receive the second switched analog signal and the set of switched reference signals and in accordance therewith provide a differential sampled analog output signal which corresponds to the single-ended analog input signal.

These and other features and advantages of the present invention will be understood upon consideration of the following detailed description of the invention and the accompanying drawings.

BRIEF DESCRIPTION OF THE DRAWINGS

FIG. 2A is a logic diagram of a control signal generator for generating the switch control signals for the circuit of FIG. 1.

FIG. 2B is a table containing the definitions of the sample control signals received as inputs by the logic circuit of FIG. 2A.

FIGS. 3A–3D illustrate the operating states of the circuit of FIG. 1 during an active clamp signal for a positive polarity input signal without CDS (NRTR).

FIG. 3E is a signal timing diagram for the circuit states represented in FIGS. 3A–3D.

FIG. 3F contains tables identifying the values and states of the timing signals and switch control signals, respectively, for the circuit states represented in FIGS. 3A–3D.

FIGS. 4A–4D illustrate the operating states of the circuit of FIG. 1 during an active clamp signal for a positive polarity input signal with CDS (RTR).

FIGS. 5A and 5B illustrate the operating states of the circuit of FIG. 1 during normal operation for a positive polarity signal without CDS (NRTR).

FIG. 5C is a signal timing diagram for the circuit states represented in FIGS. 5A and 5B.

FIG. 5D contains tables defining the values and states of the timing signals and control switches, respectively, for the circuit states represented in FIGS. 5A and 5B.

FIGS. 6A and 6B illustrate the operating states of the circuit of FIG. 1 during normal operation for a positive polarity signal with CDS (RTR).

FIG. 6C is a signal timing diagram for the circuit states represented in FIGS. 6A and 6B.

FIG. 6D contains tables defining the values and states of the timing signals and control switches, respectively, for the circuit states represented in FIGS. 6A and 6B.

FIGS. 7A and 7B illustrate the operating states of the circuit of FIG. 1 during normal operation for a negative polarity signal without CDS (NRTR).

FIG. 7C is a signal timing diagram for the circuit states represented in FIGS. 7A and 7B.

FIG. 7D contains tables defining the values and states of the timing signals and control switches, respectively, for the circuit states represented in FIGS. 7A and 7B.

FIGS. 8A and 8B illustrate the operating states of the circuit of FIG. 1 during normal operation for a negative polarity signal with CDS (RTR).

FIG. 8C is a signal timing diagram for the circuit states represented in FIGS. 8A and 8B.

FIG. 8D contains tables defining the values and states of the timing signals and control switches, respectively, for the circuit states represented in FIGS. 8A and 8B.

FIGS. 9A–9D illustrate the operating states of the circuit of FIG. 1 during the accelerated, or accumulation, mode of operation for a positive polarity signal without CDS (NRTR).

FIG. 9E contains tables defining the values and states of the timing signals and control switches, respectively, for the circuit states represented in FIGS. 9A–9D.

FIGS. 10A–10D illustrate the operating states of the circuit of FIG. 1 during the accelerated, or accumulation, mode of operation for a negative polarity signal with CDS.

FIG. 10E contains tables defining the values and states of the timing signals and control switches, respectively, for the circuit states represented in FIGS. 10A–10D.

DETAILED DESCRIPTION OF THE INVENTION

Figure 1:
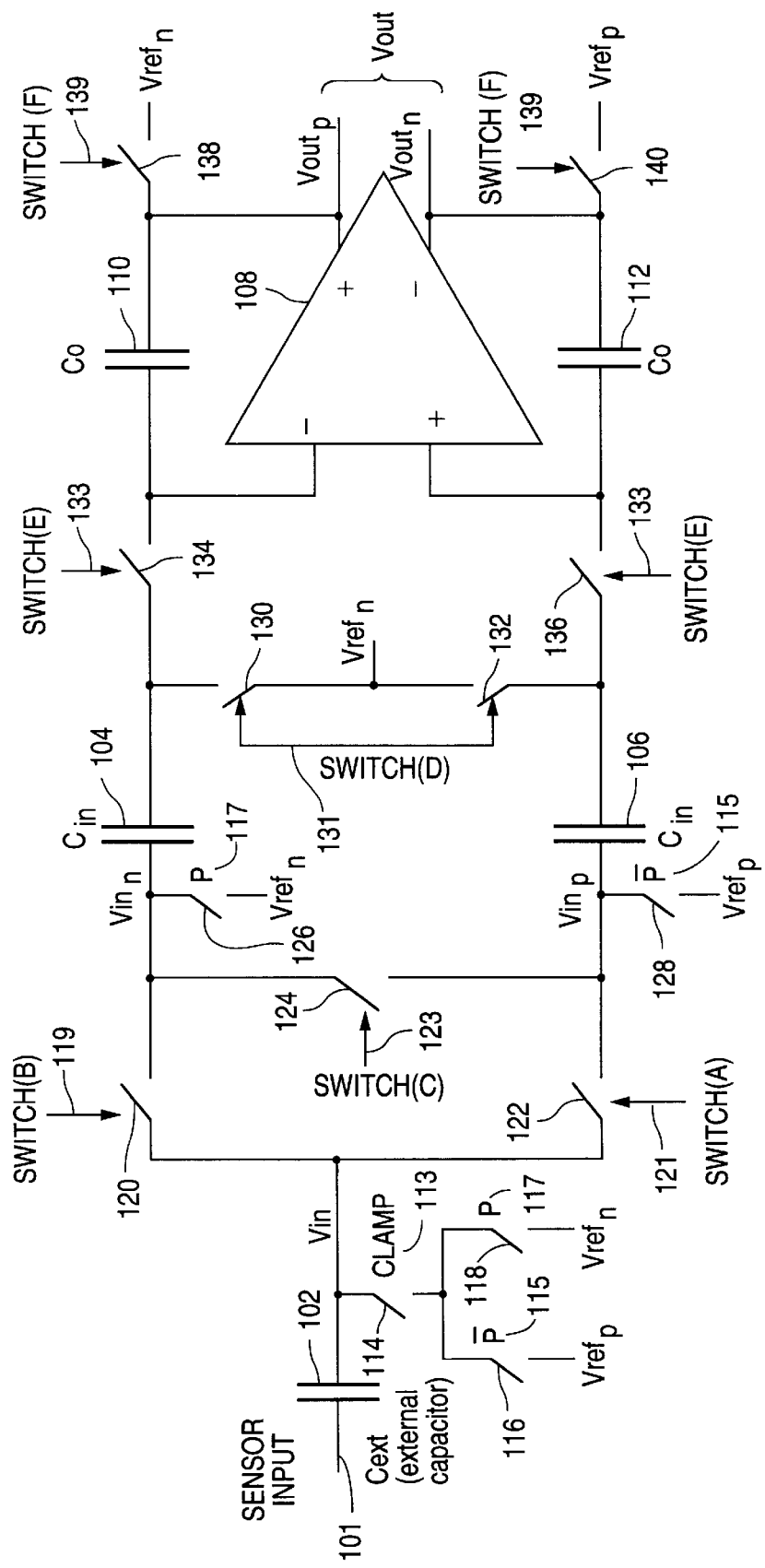
FIG. 1 is a schematic diagram of a selectively configurable analog signal sampler in accordance with one embodiment of the present invention.

Referring to FIG. 1, a selectively configurable analog signal sampler 100 for sampling multiple types of analog signals in accordance with one embodiment of the present invention includes multiple capacitive circuits in the form of input 104, 106 and output 110, 112 capacitors, an amplifier circuit 108 (e.g., folded cascode operational amplifier with differential inputs and differential outputs), and a number of switch circuits 114, 116, 118, 120, 122, 124, 126, 128, 130, 132, 134, 136, 138, 140, all interconnected substantially as shown. An additional capacitor 102 is typically used (e.g., as an external capacitor Cext when the sampler 100 is implemented in integrated circuit form) to capacitively couple the analog input signal 101, e.g., from an image sensor.

As discussed in more detail below, a signal sampler in accordance with the present invention is particularly advantageous when used as the analog front end of an imaging system with either CCD or CIS types of image sensors having return-to-reference (RTR) or non-return-to-reference (NRTR) output image signals. Further, such an analog signal sampler includes a number of re-configurable features. The input signal polarity can be positive or negative. Correlated double sampling (CDS) can be enabled (for RTR input signals) or disabled (for NRTR input signals). The input can be clamped to a fixed reference, such as during a sequence of "dummy" pixels at the beginning of each line, with such reference representing the black pixel voltage of the sensor. Additionally, pixel signal averaging can be enabled to allow for higher speed scanning of the image information.

The analog input signal 101 is capacitively coupled with the external capacitor Cext 102 and is selectively clamped by the input clamping switches 114, 16, 118 which are controlled by switch control signals CLAMP 113, $\overline{P}$ 115, P 117. (The various switch control signals are discussed in more detail below with timing diagrams and state tables for various examples of input signals and operating conditions.) The resulting analog input signal Vin is clamped to one of the two reference voltages $Vref_p$, $Vref_n$ and is used to selectively charge one or more of the input capacitors Cin 104, 106 in accordance with the closed and open states of switches B 120, A 122, C 124, 126 and 128 as established by their respective control signals SWITCH(B) 119, SWITCH(A) 121, SWITCH(C) 123, P 117 and $\overline{P}$ 115. The resulting charges established across these input capacitors 104, 106 are then selectively transferred to the output capacitors Co 110, 112 and amplified by the amplifier 108 in accordance with the closed and open states of switches D 130, D 132, E 134, E 136, F 138 and F 140 as established by their respective control signals SWITCH(D) 131, SWITCH(E) 133 and SWITCH(F) 139. As a result, a differential output voltage Vout (with positive $Vout_p$ and negative $Vout_n$ signal phases) is produced which corresponds to the single-ended input signal 101.

Referring to FIG. 2A, a control signal generator 200 suitable for generating the various switch control signals (with the exception of the clamp signal CLAMP 113) includes a number of logic circuits 202, 204, 206, 208, 210, 212, 214, connected substantially as shown. A polarity signal is used to generate the P and $\overline{P}$ control signals, and is used in logical combination with the clamp signal CLAMP, a sample and hold clock signal CLM and a correlated double sampling signal CDS to generate the SWITCH(A) and SWITCH(B) control signals. The CLM and CDS signals are combined to generate the SWITCH(C) signal, while the CLM signal is used directly as the SWITCH(D) signal. The CLM signal and a "turbo" signal TURBO (discussed in more detail below) are combined to generate the SWITCH(E) and SWITCH(F) signals. Referring to FIG. 2B, the above-discussed polarity, CDS, CLAMP, TURBO and CLM signals are described in terms of their respective functionalities and effects upon operation of the sampler 100 when in their respective high and low logic states.

Figure 2C:
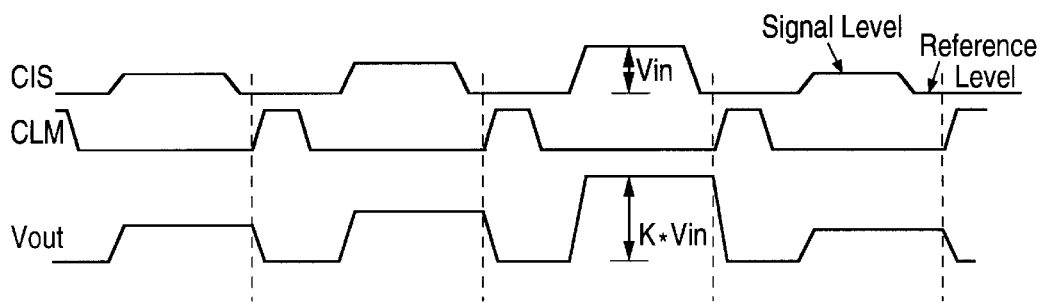
FIGS. 2C–2F are timing diagrams representing sampling of various types of analog image signals using the circuit of FIG. 1.
Figure 2D:
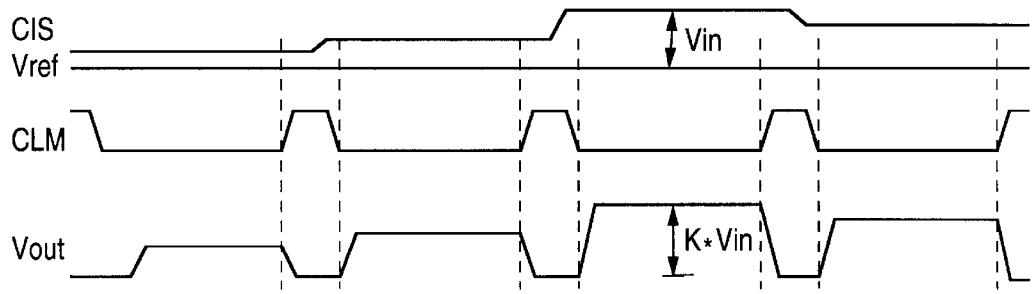
Figure 2E:
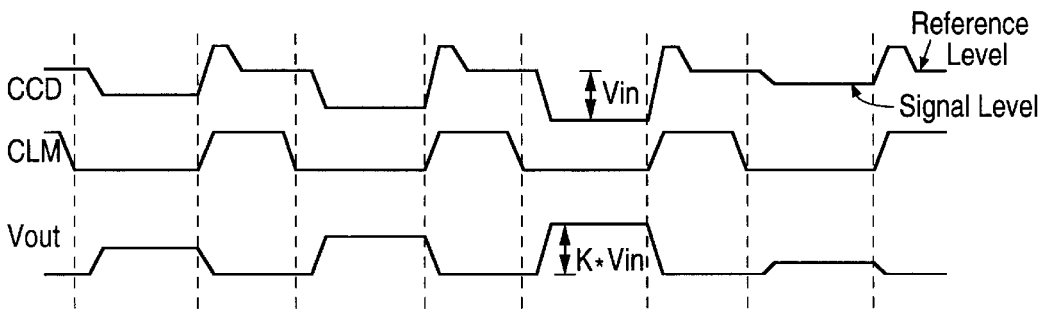
Figure 2F:
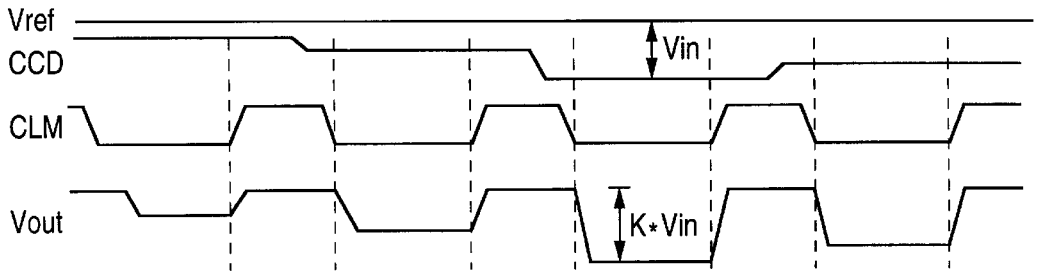
Figures 4E, 4F:
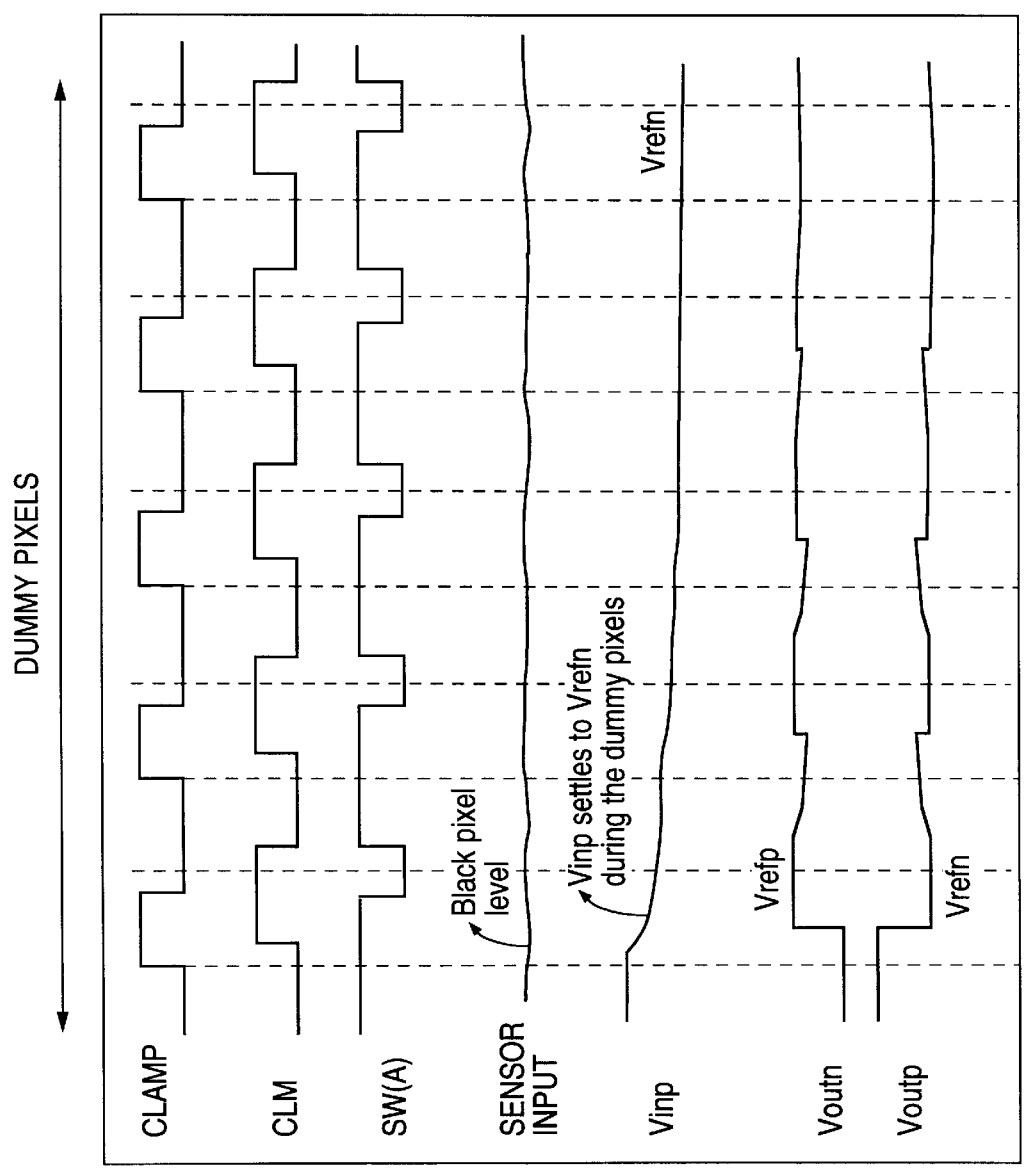
FIG. 4E is a signal timing diagram for the circuit states represented in FIGS. 4A–4D.
FIG. 4F contains tables identifying the values and states of the timing signals and switch control signals, respectively, for the circuit states represented in FIGS. 4A–4D.

Referring to FIGS. 2C, 2D, 2E and 2F, the resulting differential output signal Vout from the circuit of FIG. 1 is shown for various types of analog input signals. For example, FIGS. 2C and 2D illustrate the resulting output signals Vout based upon the sampling of positive-polarity RTR and NRTR types of analog input signals from a CIS sensor, respectively. FIGS. 2E and 2F illustrate the resulting output signals Vout based upon the sampling of negative-polarity RTR and NRTR types of signals from a CCD sensor, respectively.

As discussed in more detail below in connection with a number of examples, the basic principles of operation for the circuit of FIG. 1 are as follows. The sampler 100 can be used for positive and negative polarity input signals 101, either with or without correlated double sampling in both regular and "turbo" modes of operation. For a positive polarity input signal 101, the P signal 117 is high, switch 120 stays open and input voltage $Vin_n$ is clamped to reference voltage $Vref_n$. For a negative polarity input signal 101, the P signal 117 is low ($\overline{P}$ is high), switch 122 stays open and input voltage $Vin_p$ is clamped to reference voltage $Vref_p$. With correlated double sampling enabled, switch 120/122 (for positive/negative input signal 101 polarity) remains closed and switch 124 remains open, while input voltage Vin goes to reference voltage $Vref_n/Vref_p$ during the high state of the input clock signal CLM. With correlated double sampling disabled, switch 120/122 opens when the clock signal CLM is high, and switch 124 closes when the clock signal CLM is high and charges input voltages $Vin_n$ and $Vin_p$ to reference voltage $Vref_n/Vref_p$. Before each image line is scanned, input voltage Vin is precharged to a reference voltage which represents the black pixel value.

At the beginning of each line of pixel information, the sensor sends out a stream of dummy black pixels. During this time, the CLAMP signal is asserted (high) and input voltage Vin is charged to a fixed reference voltage which represents the black pixel level. All subsequent signal levels within the line are then referenced to this voltage Vin. For a positive polarity input signal 101, signal SWITCH(A) closes switch 122 during assertion of the CLAMP signal (regardless of the values of signals CLM and CDS), thereby charging input voltage $Vin_p$ to the value of voltage Vin (=$Vref_n$). Thus, for positive polarity input signals 101, with or without correlated double sampling, the reference voltage is $Vref_n$.

For a negative polarity input signal 101, signal SWITCH(B) closes switch 120 during assertion of the clamp signal CLAMP (regardless of the values of signals CLM and CDS), thereby charging input voltage $Vin_n$ to the value of voltage Vin (=$Vref_p$). Thus, for negative polarity input signals 101, with or without correlated double sampling, the reference voltage is $Vref_p$.

FIGS. 3A–3D illustrate the operating states of the circuit of FIG. 1 during operation of the clamp signal CLAMP for a positive polarity input signal 101 without correlated double sampling. FIG. 3E is a signal timing diagram representing the states of the various signals for the circuit states of FIGS. 3A–3D. FIG. 3F identifies, in tabular form, the values of the timing signals and states of the control switches during this mode of operation. During this mode of operation, the input signal 101 is fixed at a black pixel level, input voltage $Vin_n$ equals reference voltage $Vref_n$ and input voltage $Vin_p$ settles to reference voltage $Vref_n$. The phase relation between the clamp signal CLAMP and clock signal CLM is unknown, the duty cycle of the clamp signal CLAMP may be any value, and signals CLAMP and CLM have the same signal period.

FIGS. 4A–4D illustrate the operating states of the circuit 100 during the clamp mode of operation for a positive polarity input signal 101 with correlated double sampling. FIG. 4E is a signal timing diagram for selected signals during such circuit states. FIG. 4F indicates, in tabular form, the values of the timing signals and states of the control switches during this mode of operation.

FIGS. 5A and 5B illustrate the operating states of the circuit 100 during its normal mode of operation for a positive polarity input signal 101 without correlated double sampling. FIG. 5C is a signal timing diagram for selected signals during such circuit states. FIG. 5D indicates, in tabular form, the values of the timing signals and states of the control switches during such operation. In this mode of operation, the input signal 101 remains fixed while the clock signal CLM is low, input voltage $Vin_n$ equals reference voltage $Vref_n$, and input voltage $Vin_p$ ranges between reference voltage $Vref_n$ (black) and reference voltage $Vref_p$ (white).

FIGS. 6A and 6B illustrate the operating states of the circuit 100 during its normal mode of operation for a positive polarity input signal 101 with correlated double sampling. FIG. 6C is a signal timing diagram for selected signals during such circuit states. FIG. 6D indicates, in tabular form, the values of the timing signals and states of the control switches during such operation. During such operation, the input signal 101 changes after de-assertion of the clock signal CLM, input voltage $Vin_n$ equals reference voltage $Vref_n$, and input voltage $Vin_p$ ranges between reference voltage $Vref_n$ (black) and reference voltage $Vref_p$ (white).

FIGS. 7A and 7B illustrate the operating states of the circuit 100 during its normal mode of operation for a negative polarity input signal 101 without correlated double sampling. FIG. 7C is a signal timing diagram for selected signals during such circuit states. FIG. 7D indicates, in tabular form, the values of the timing signals and states of the control switches during such operation. During such operation, the input signal 101 remains fixed while the clock signal CLM is low, input voltage $Vin_n$ ranges between reference voltage $Vref_n$ (white) and reference voltage $Vref_p$ (black), and input voltage $Vin_p$ equals reference voltage $Vref_p$.

FIGS. 8A and 8B illustrate the operating states of the circuit 100 during its normal mode of operation for a negative polarity input signal 101 with correlated double sampling. FIG. 8C is a signal timing diagram for selected signals during such circuit states. FIG. 8D indicates, in tabular form, the values of the timing signals and states of the control switches during such operation. During such operation, the input signal 101 changes after de-assertion of the clock signal CLM, input voltage $Vin_n$ equals reference voltage $Vref_n$, and input voltage $Vin_p$ ranges between reference voltage $Vref_n$ (white) and reference voltage $Vref_p$ (black).

Figure 9F:
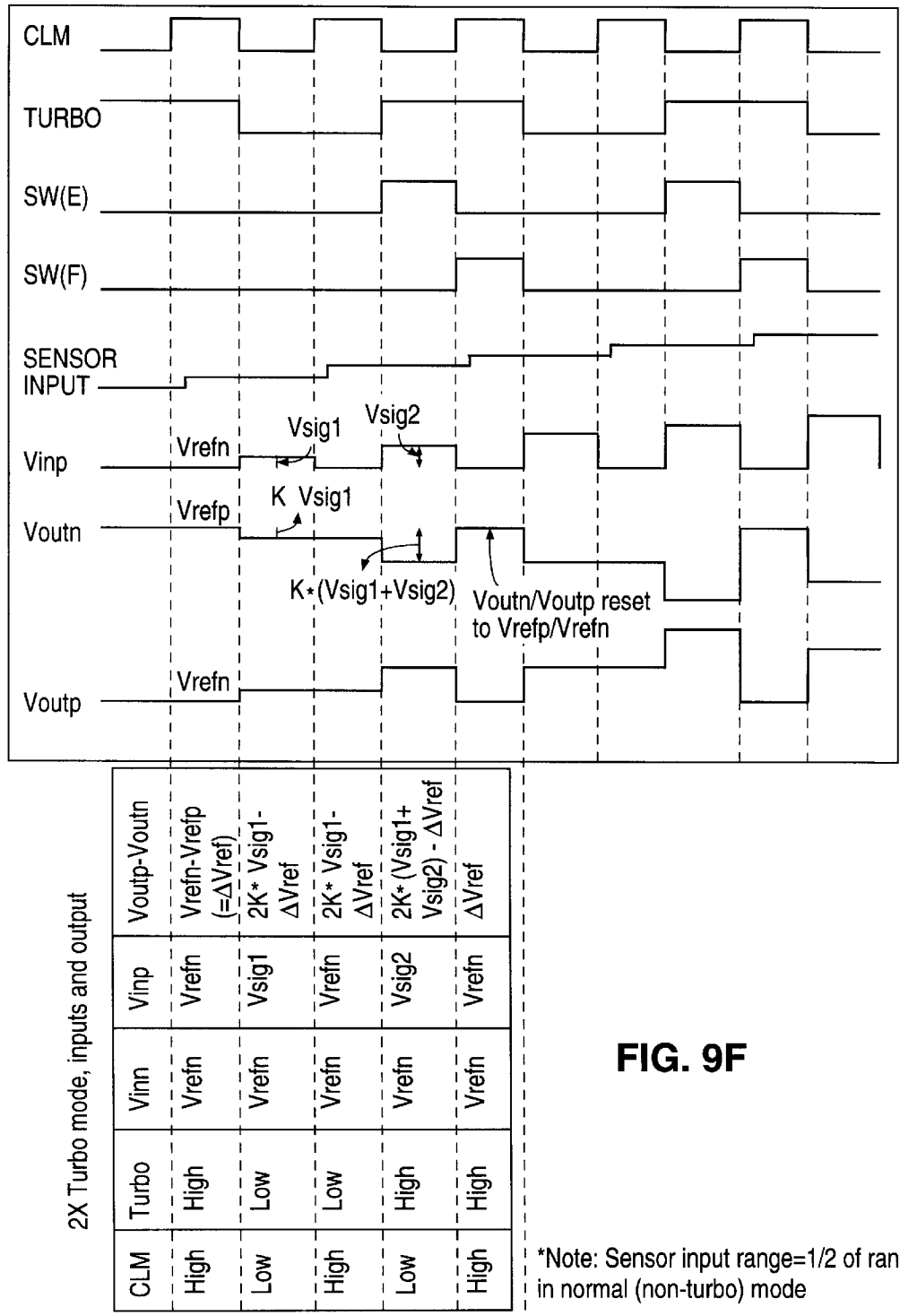
FIGS. 9F and 9G are signal timing diagrams and corresponding tables defining the input and output signals for the circuit states represented in FIGS. 9A–9D with performance acceleration factors of 2× and 3×, respectively.
Figure 9G:
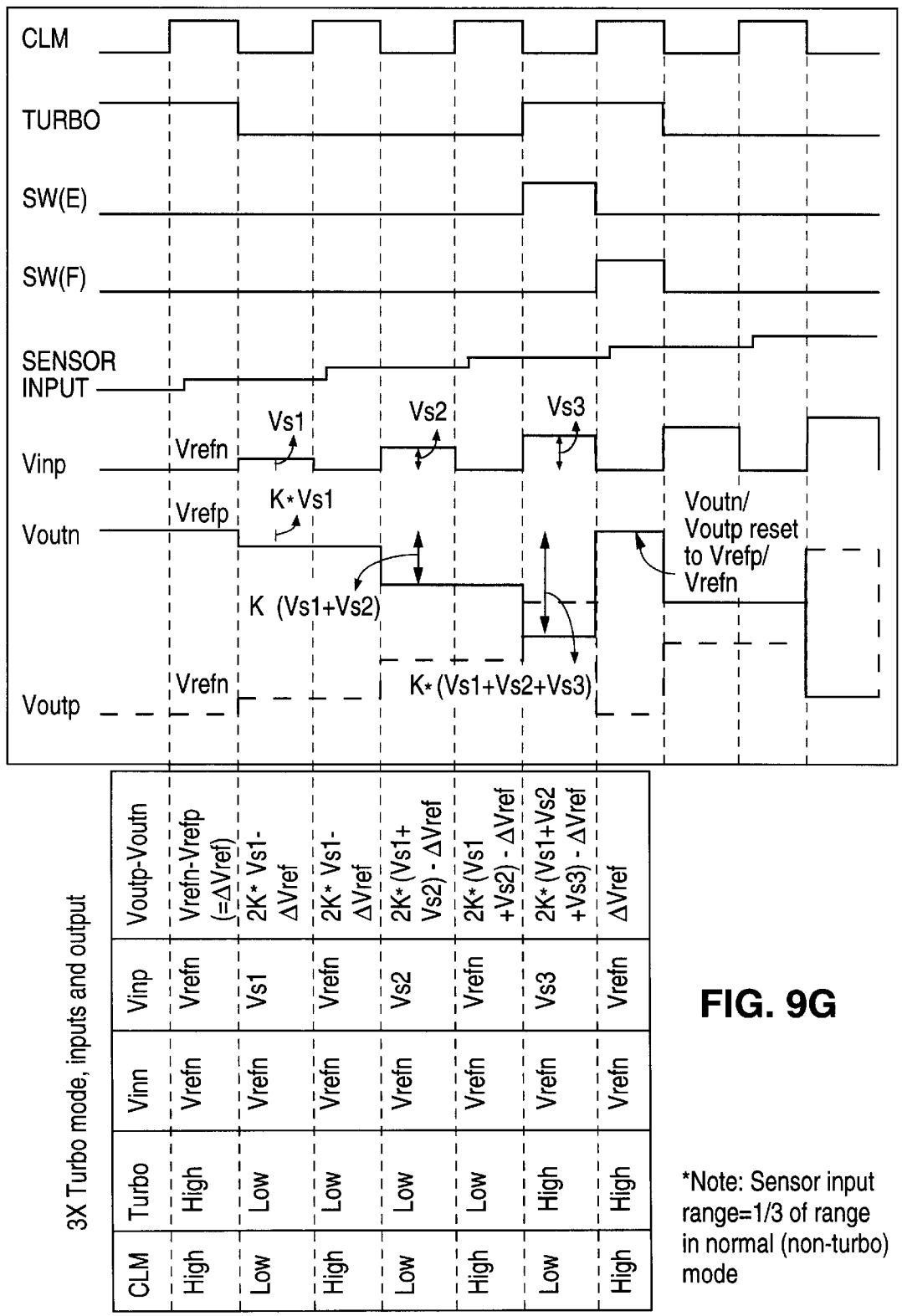
Figure 10F:
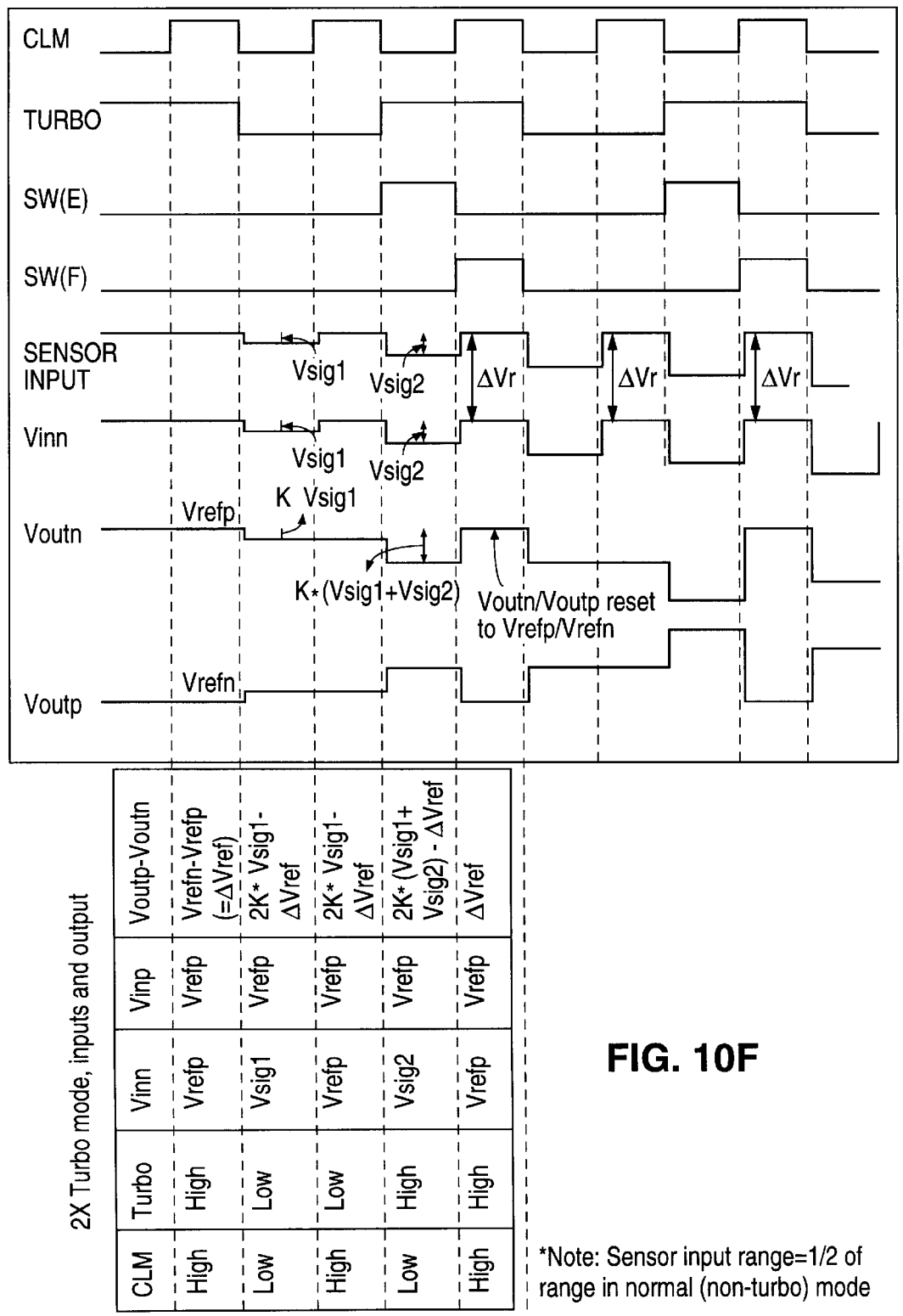
FIG. 10F is a signal timing diagram and corresponding table defining the input and output signals for the circuit states represented in FIGS. 10A–10D with a performance acceleration factor of 2×.

FIGS. 9A–9D illustrate the operating states of the circuit 100 during its "turbo" mode of operation (i.e., pixel averaging) for a positive polarity input signal 101 without correlated double sampling. FIG. 9E indicates, in tabular form, the values of the timing signals and states of the control switches during such operation. FIG. 9F is a signal timing diagram and corresponding table representing the states of selected signals during such circuit states for a "2×" pixel averaging mode of operation (i.e., where two adjacent pixels are averaged together). FIG. 9G is a signal timing diagram and corresponding table representing the states of selected signals during such circuit states for a "3×" pixel averaging mode of operation (i.e., where three adjacent pixels are averaged together).

FIGS. 10A–10D illustrate the operating states of the circuit 100 during its "turbo" mode of operation for a negative polarity input signal 101 with correlated double sampling. FIG. 10E indicates, in tabular form, the values of the timing signals and states of the control switches during such operation. FIG. 10F is a signal timing diagram and corresponding table representing the states of selected signals during such circuit states for a "2×" pixel averaging mode of operation. (Ideally, the sensor signal 101 returns to a fixed reference level at every pixel. If the reference level shifts then the value of voltage $Vin_n$ will also shift and may not be equal to reference voltage $Vref_p$. However, the value of voltage Vsig (the difference between the reference level and the signal level at each pixel) is exactly the same as voltage $Vin_n$ as in the sensor input.

Figure 11:
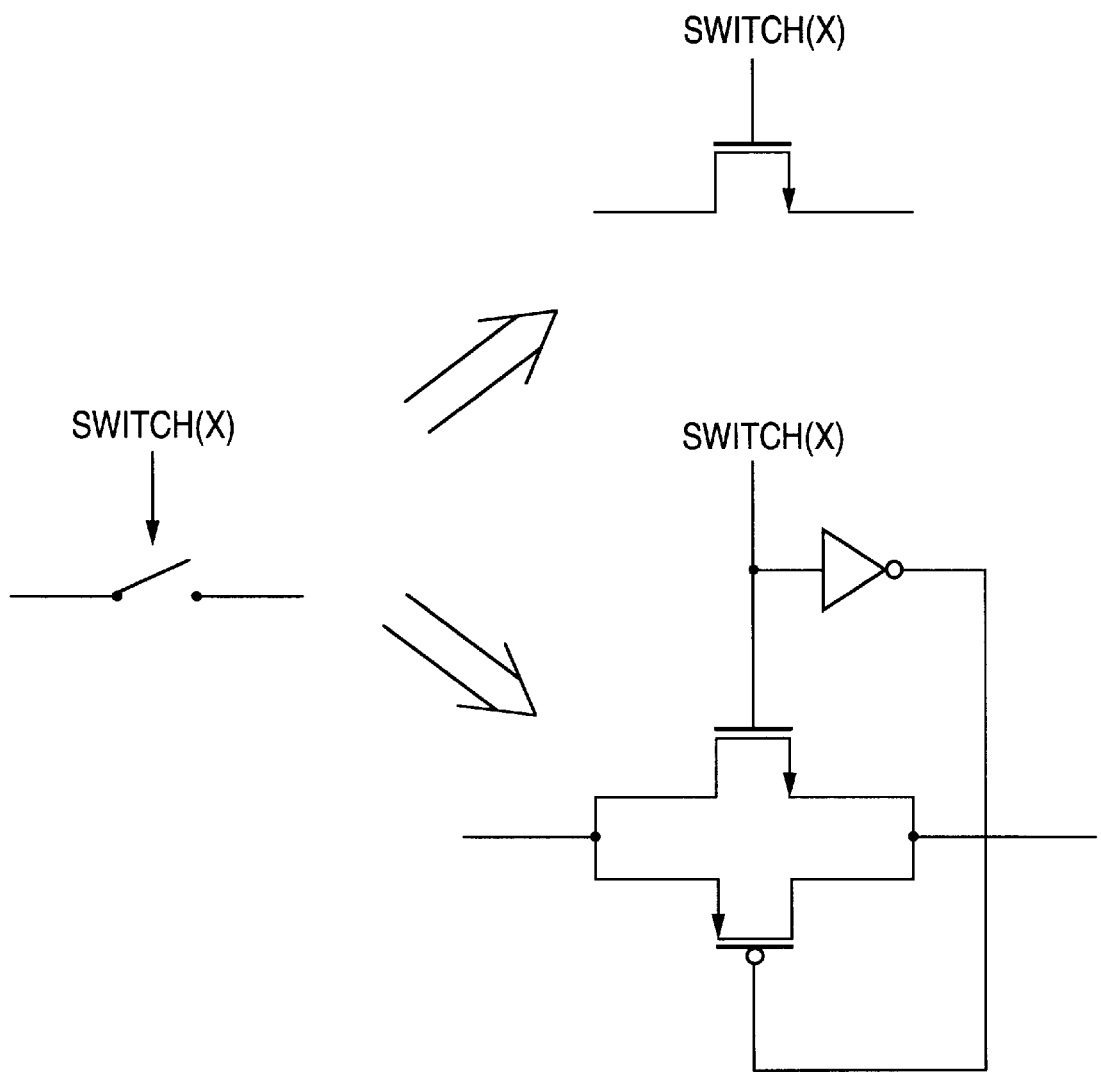
FIG. 11 illustrates how the various switch circuits can be inplemented using pass transistors individually or in paris as transmission gates.

Referring to FIG. 11, in accordance with well known, conventional circuit design techniques, it will be readily understood that the various switch circuits 114, 116, 118, 120, 122, 124, 126, 128, 130, 132, 134, 136, 138, 140 can be implemented in a number of ways including the use of pass transistors either individually or in pairs as transmission gates. This is the advantage of using correlated double sampling.)

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a selectively configurable analog signal sampler for sampling a plurality of types of analog signals, comprising:

a plurality of capacitive circuits;

an amplifier circuit coupled to said plurality of capacitive circuits; and a plurality of switch circuits, coupled to said plurality of capacitive circuits and said amplifier circuit, configured to receive a plurality of reference signals and a plurality of switch control signals and in accordance therewith couple together selected portions of said plurality of capacitive circuits, couple selected portions of said plurality of reference signals to said amplifier circuit and to further selected portions of said plurality of capacitive circuits, and couple said amplifier circuit to still further selected portions of said plurality of capacitive circuits;

wherein said plurality of capacitive circuits, said amplifier circuit and said plurality of switch circuits, together and in accordance with said plurality of reference signals and a plurality of combinations of said plurality of switch control signals, receive and couple a single-ended analog input signal to said plurality of capacitive circuits and said amplifier circuit and in accordance therewith provide a differential sampled analog output signal which corresponds to said single-ended analog input signal; and wherein said single-ended analog input signal has one or more signal characteristics which include a positive signal polarity, a negative signal polarity, a return-to-reference signal waveform and a non-return-to-reference signal waveform.

2. The apparatus of claim 1, wherein said single-ended analog input signal includes a plurality of input signal values at an input signal rate and in accordance with one of said plurality of combinations of said plurality of switch control signals:

said differential sampled analog output signal includes a plurality of output signal values at an output signal rate which is 1/N-times said input signal rate; and each one of said plurality of output signal values corresponds to an accumulation of N input signal values.

3. The apparatus of claim 1, wherein said plurality of switch circuits comprises a plurality of pass transistors.

4. The apparatus of claim 1, wherein said amplifier circuit comprises an operational amplifier with differential input and output terminals.

5. The apparatus of claim 4, wherein said plurality of capacitive circuits includes a plurality of feedback capacitors coupled between said differential input and output terminals.

6. The apparatus of claim 1, wherein said plurality of capacitive circuits includes an input coupling capacitor configured to receive and ac-couple said single-ended analog input signal.

7. The apparatus of claim 1, further comprising a control signal generator, coupled to said plurality of switch circuits, configured to receive and process a plurality of sample control signals and in accordance therewith provide said plurality of switch control signals.

8. An apparatus including a selectively configurable analog signal sampler for sampling a plurality of types of analog signals, comprising:

a first switching stage configured to receive a first portion of a plurality of switch control signals and in accordance therewith receive a first portion of a plurality of reference signals and receive and switch a single-ended analog input signal and in accordance therewith provide a first switched analog signal, wherein said single-ended analog input signal has one or more signal characteristics which include a positive signal polarity, a negative signal polarity, a return-to-reference signal waveform and a non-return-to-reference signal waveform;

a first capacitive stage, coupled to said first switching stage, configured to receive and capacitively couple said first switched analog signal and in accordance therewith provide a coupled analog signal;

a second switching stage, coupled to said first capacitive stage, configured to receive a second portion of said plurality of switch control signals and in accordance therewith receive a second portion of said plurality of reference signals and receive and switch said coupled analog signal and in accordance therewith provide a second switched analog signal;

a second capacitive stage, coupled to said second switching stage;

an amplifier stage, coupled to said second switching stage and said second capacitive stage; and a third switching stage, coupled to said amplifier stage and said second capacitive stage, configured to receive a third portion of said plurality of switch control signals and in accordance therewith receive and switch a third portion of said plurality of reference signals and in accordance therewith provide a plurality of switched reference signals;

wherein said amplifier stage and said second capacitive stage together receive said second switched analog signal and said plurality of switched reference signals and in accordance therewith provide a differential sampled analog output signal which corresponds to said single-ended analog input signal.

9. The apparatus of claim 8, wherein said single-ended analog input signal includes a plurality of input signal values at an input signal rate and in accordance with a combination of said first, second and third portions of said plurality of switch control signals:

said differential sampled analog output signal includes a plurality of output signal values at an output signal rate which is 1/N-times said input signal rate; and each one of said plurality of output signal values corresponds to an accumulation of N input signal values.

10. The apparatus of claim 8, wherein said first, second and third switching stages comprise first, second and third pluralities of pass transistors.

11. The apparatus of claim 8, wherein said amplifier stage comprises an operational amplifier with differential input and output terminals.

12. The apparatus of claim 11, wherein said second capacitive stage comprises a plurality of feedback capacitors coupled between said differential input and output terminals.

13. The apparatus of claim 8, further comprising an input capacitive stage configured to receive and ac-couple said single-ended analog input signal.

14. The apparatus of claim 8, further comprising a control signal generator, coupled to said first, second and third switching stages, configured to receive and process a plurality of sample control signals and in accordance therewith provide said plurality of switch control signals.

15. A method of sampling a plurality of types of analog signals, said method comprising the steps of:

receiving a plurality of reference signals and a plurality of switch control signals and in accordance therewith coupling together selected portions of a plurality of capacitive circuits;

coupling selected portions of said plurality of reference signals to an amplifier circuit and to further selected portions of said plurality of capacitive circuits, and coupling said amplifier circuit to still further selected portions of said plurality of capacitive circuits; and in accordance with said plurality of reference signals and a plurality of combinations of said plurality of switch control signals, receiving and coupling a single-ended analog input signal to said plurality of capacitive circuits and said amplifier circuit and in accordance therewith generating a differential sampled analog output signal which corresponds to said single-ended analog input signal, wherein said single-ended analog input signal has one or more signal characteristics which include a positive signal polarity, a negative signal polarity, a return-to-reference signal waveform and a non-return-to-reference signal waveform.

16. The method of claim 15, wherein said step of receiving and coupling a single-ended analog input signal to said plurality of capacitive circuits and said amplifier circuit and in accordance therewith generating a differential sampled analog output signal which corresponds to said single-ended analog input signal comprises:

receiving a single-ended analog input signal which includes a plurality of input signal values at an input signal rate; and in accordance with one of said plurality of combinations of said plurality of switch control signals, generating a differential sampled analog output signal which includes a plurality of output signal values at an output signal rate which is 1/N-times said input signal rate, wherein each one of said plurality of output signal values corresponds to an accumulation of N input signal values.

17. The method of claim 15, wherein said step of coupling selected portions of said plurality of reference signals to an amplifier circuit and to further selected portions of said plurality of capacitive circuits comprises coupling said selected portions of said plurality of reference signals to differential input and output terminals of an operational amplifier.

18. The method of claim 17, wherein said step of coupling said amplifier circuit to still further selected portions of said plurality of capacitive circuits comprises coupling a plurality of feedback capacitors between said differential input and output terminals.

19. The method of claim 15, wherein said step of receiving and coupling a single-ended analog input signal to said plurality of capacitive circuits and said amplifier circuit and in accordance therewith generating a differential sampled analog output signal which corresponds to said single-ended analog input signal comprises ac-coupling said single-ended analog input signal to said plurality of capacitive circuits.

20. The method of claim 15, further comprising the step of receiving and processing a plurality of sample control signals and in accordance therewith generating said plurality of switch control signals.

21. A method of sampling a plurality of types of analog signals, said method comprising the steps of:

receiving a first portion of a plurality of switch control signals and in accordance therewith receiving a first portion of a plurality of reference signals and receiving and switching a single-ended analog input signal and in accordance therewith generating a first switched analog signal, wherein said single-ended analog input signal has one or more signal characteristics which include a positive signal polarity, a negative signal polarity, a return-to-reference signal waveform and a non-return-to-reference signal waveform;

receiving and capacitively coupling said first switched analog signal and in accordance therewith generating a coupled analog signal;

receiving a second portion of said plurality of switch control signals and in accordance therewith receiving a second portion of said plurality of reference signals and receiving and switching said coupled analog signal and in accordance therewith generating a second switched analog signal;

receiving a third portion of said plurality of switch control signals and in accordance therewith receiving and switching a third portion of said plurality of reference signals and in accordance therewith generating a plurality of switched reference signals; and receiving said second switched analog signal and said plurality of switched reference signals and in accordance therewith generating a differential sampled analog output signal which corresponds to said single-ended analog input signal.

22. The method of claim 21, wherein:

said step of receiving a first portion of a plurality of switch control signals and in accordance therewith receiving a first portion of a plurality of reference signals and receiving and switching a single-ended analog input signal and in accordance therewith generating a first switched analog signal comprises receiving a single-ended analog input signal which includes a plurality of input signal values at an input signal rate; and said step of receiving said second switched analog signal and said plurality of switched reference signals and in accordance therewith generating a differential sampled analog output signal which corresponds to said single-ended analog input signal comprises generating, in accordance with a combination of said first, second and third portions of said plurality of switch control signals, a differential sampled analog output signal which includes a plurality of output signal values at an output signal rate which is 1/N-times said input signal rate, wherein each one of said plurality of output signal values corresponds to an accumulation of N input signal values.

23. The method of claim 21, further comprising the step of receiving and ac-coupling said single-ended analog input signal prior to said receiving and switching of said single-ended analog input signal and in accordance therewith generating said first switched analog signal.

24. The method of claim 21, further comprising the step of receiving and processing a plurality of sample control signals and in accordance therewith generating said plurality of switch control signals.

\* \* \* \* \*